(12) United States Patent
Kitahara et al.

(10) Patent No.: US 10,404,226 B2
(45) Date of Patent: Sep. 3, 2019

(54) POWER AMPLIFIER MODULE

(71) Applicant: Murata Manufacturing Co., Ltd., Kyoto (JP)

(72) Inventors: Takashi Kitahara, Kyoto (JP); Hiroaki Nakayama, Kyoto (JP); Tsunekazu Saimei, Kyoto (JP); Hiroki Noto, Kyoto (JP); Koichiro Kawasaki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 7 days.

(21) Appl. No.: 15/654,219

(22) Filed: Jul. 19, 2017

(65) Prior Publication Data

US 2017/0317002 A1 Nov. 2, 2017

Related U.S. Application Data

(63) Continuation of application No. PCT/JP2015/079742, filed on Oct. 21, 2015.

(30) Foreign Application Priority Data

Jan. 21, 2015 (JP) .................................. 2015-009763

(51) Int. Cl.
*H01L 23/12* (2006.01)
*H03F 3/21* (2006.01)
(Continued)

(52) U.S. Cl.
CPC ............... *H03F 3/21* (2013.01); *H01L 23/12* (2013.01); *H01L 23/3121* (2013.01);
(Continued)

(58) Field of Classification Search
CPC . H03F 3/21; H01L 23/12; H01L 23/36; H01L 25/04
(Continued)

(56) References Cited

U.S. PATENT DOCUMENTS

2003/0169575 A1* 9/2003 Ikuta .................... H01L 23/3677
361/761
2008/0315404 A1* 12/2008 Eichelberger ....... H01L 21/6835
257/713
(Continued)

FOREIGN PATENT DOCUMENTS

JP 2005-311230 A 11/2005
JP 2007-142812 A 6/2007
(Continued)

OTHER PUBLICATIONS

International Search Report issued in Application No. PCT/JP2015/079742 dated Dec. 15, 2015.
(Continued)

*Primary Examiner* — Long K Tran
(74) *Attorney, Agent, or Firm* — Pearne & Gordon LLP

(57) ABSTRACT

A power amplifier module includes a substrate, a power amplifier having a first surface on which an electrode is defined and a second surface opposite the first surface, the first surface faces a principal surface of the substrate, a surface acoustic wave duplexer having a first surface on which an electrode is defined and a second surface opposite the first surface, the first surface faces the principal surface of the substrate, a heat dissipation unit defined on another principal surface of the substrate, a heat dissipation path that connects a connecting portion between the power amplifier and the principal surface to the heat dissipation unit, an insulating resin that covers the power amplifier and the surface acoustic wave duplexer, a conductive shield that covers the insulating resin, and a first conductive unit defined on the second surface of the surface acoustic wave duplexer and electrically connected to the conductive shield.

14 Claims, 6 Drawing Sheets

(51) Int. Cl.
*H01L 25/04* (2014.01)
*H01L 25/18* (2006.01)
*H01L 23/31* (2006.01)
*H01L 23/367* (2006.01)
*H01L 23/498* (2006.01)

(52) U.S. Cl.
CPC .......... *H01L 23/3677* (2013.01); *H01L 25/04* (2013.01); *H01L 25/18* (2013.01); *H01L 23/49827* (2013.01); *H01L 2224/14* (2013.01); *H01L 2224/16225* (2013.01); *H01L 2224/73253* (2013.01); *H01L 2924/15313* (2013.01); *H01L 2924/181* (2013.01); *H01L 2924/3025* (2013.01)

(58) Field of Classification Search
USPC ........................................................ 257/706
See application file for complete search history.

(56) References Cited

U.S. PATENT DOCUMENTS

2009/0170242 A1* 7/2009 Lin ...................... H01L 21/6835
438/107
2009/0302437 A1* 12/2009 Kim ...................... H01L 21/561
257/659
2011/0006106 A1 1/2011 Kanryo
2011/0175179 A1 7/2011 Chiu
2013/0122833 A1 5/2013 Hadjichristos

FOREIGN PATENT DOCUMENTS

| | | |
|---|---|---|
| JP | 2007-266539 A | 10/2007 |
| JP | 2009-277910 A | 11/2009 |
| JP | 2012-182395 A | 9/2012 |
| JP | 2014-120966 A | 6/2014 |
| JP | 2014-533911 A | 12/2014 |
| WO | 2009/119374 A1 | 10/2009 |
| WO | 2010/041356 A1 | 4/2010 |

OTHER PUBLICATIONS

Written Opinion issued in Application No. PCT/JP2015/079742 dated Dec. 15, 2015.
CN Office Action for Chinese Patent Application No. 201580048597.X dated Jun. 19, 2019.

* cited by examiner

POWER AMPLIFIER MODULE

This is a continuation of International Application No. PCT/JP2015/079742 filed on Oct. 21, 2015 which claims priority from Japanese Patent Application No. 2015-009763 filed on Jan. 21, 2015. The contents of these applications are incorporated herein by reference in their entireties.

BACKGROUND

Technical Field

The present disclosure relates to a power amplifier module.

In a radio communication device such as a cellular phone, a power amplifier (PA) is used to amplify power of a radio frequency (RF) signal to be transmitted to a base station. In the radio communication device, furthermore, a duplexer is used to separate a reception signal from a base station and a transmission signal to the base station to share an antenna between transmission and reception. Examples of the duplexer include a surface acoustic wave (SAW) duplexer (for example, Patent Document 1).

In recent years, with increased compactness of radio communication devices, power amplifier modules in which a power amplifier and a duplexer are packaged as a single product have attracted attention (for example, Patent Document 2). Furthermore, face-down mounting is known as a mounting method for making a module compact (for example, Patent Document 3).

Patent Document 1: Japanese Unexamined Patent Application Publication No. 2014-120966
Patent Document 2: Japanese Unexamined Patent Application Publication No. 2005-311230
Patent Document 3: Japanese Unexamined Patent Application Publication No. 2007-266539

BRIEF SUMMARY

In a power amplifier module, heat from a heat-producing component such as a power amplifier needs to be dissipated. For example, in a semiconductor device disclosed in Patent Document 3, an emitter electrode of a power amplifier mounted face-down on a front surface of a package substrate is connected to a thermal via formed in the package substrate, resulting in heat of the power amplifier being dissipated from a rear surface of the package substrate. In this manner, it is possible to dissipate the heat of the face-down mounted power amplifier from the rear surface of the package substrate through the thermal via.

However, as disclosed in, for example, Patent Document 1, a SAW duplexer has a cavity that is an operating space of an interdigital electrode unit serving as a heating element. In a case where the SAW duplexer is mounted face-down, it is difficult to dissipate heat through a thermal via since the cavity exists between the interdigital electrode unit and the package substrate.

The present disclosure has been made in view of the circumstances described above, and the present disclosure improves the heat dissipation capability of a power amplifier module including a power amplifier and a SAW duplexer.

A power amplifier module according to an aspect of the present disclosure includes a substrate having first and second principal surfaces, a power amplifier having a first surface on which an electrode is defined and a second surface opposite the first surface, the power amplifier being mounted so that the first surface faces the first principal surface of the substrate, a surface acoustic wave duplexer having a first surface on which an electrode is defined and a second surface opposite the first surface, the surface acoustic wave duplexer being mounted so that the first surface faces the first principal surface of the substrate, a heat dissipation unit defined on the second principal surface of the substrate, a heat dissipation path that connects at least part of a connecting portion between the power amplifier and the first principal surface to the heat dissipation unit, an insulating resin that covers the power amplifier and the surface acoustic wave duplexer, a conductive shield that covers a surface of the insulating resin, and a first conductive unit defined on the second surface of the surface acoustic wave duplexer and electrically connected to the conductive shield.

According to the present disclosure, the heat dissipation capability of a power amplifier module including a power amplifier and a SAW duplexer can be improved.

DETAILED DESCRIPTION

Figure 1:
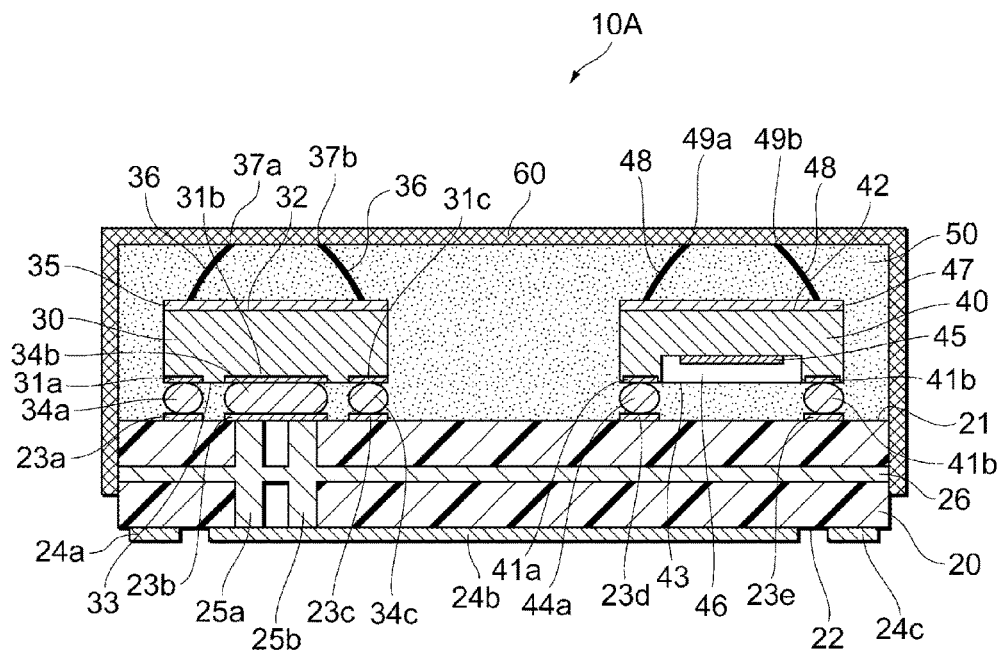
FIG. 1 is a diagram illustrating a configuration of a power amplifier module 10A according to an embodiment of the present disclosure.

An embodiment of the present disclosure will be described hereinafter with reference to the drawings. FIG. 1 is a diagram illustrating a configuration of a power amplifier module 10A according to an embodiment of the present disclosure.

As illustrated in FIG. 1, the power amplifier module 10A includes a power amplifier 30 and a SAW duplexer 40, which are mounted face-down on a package substrate 20. The power amplifier 30 and the SAW duplexer 40 are covered with an insulating resin 50. The insulating resin 50 is formed of an epoxy resin, for example. A surface of the insulating resin 50 is covered with a conductive shield 60. The conductive shield 60 is formed of a metal such as gold, silver, copper, or aluminum, for example.

The package substrate 20 has a top surface 21 (a first principal surface) and a bottom surface 22 (a second principal surface). Wiring patterns 23a to 23e are defined on the top surface 21 of the package substrate 20. Further, electrodes 24a to 24c are defined on the bottom surface 22 of the package substrate 20. In addition, the package substrate 20 has thermal vias 25a and 25b extending therethrough from the top surface 21 to the bottom surface 22. The thermal vias 25a and 25b (heat dissipation paths) electrically connect the wiring pattern 23b and the electrode 24b to each other. The electrode 24b is a ground electrode to which a ground potential is applied, and also serves as a heat dissipation unit. The package substrate 20 also has ground wiring 26 defined therein. The ground wiring 26 is connected to the electrode 24b through, for example, the thermal vias 25a and 25b.

The power amplifier 30 is a component that amplifies an RF signal to be transmitted to a base station, and includes a transistor for power amplification, for example. The power amplifier 30 has a surface 33 (a first surface) on which electrodes 31a to 31c are defined, and a surface 32 (a second surface) opposite the surface 33. The power amplifier 30 is mounted face-down on the top surface 21 of the package substrate 20 via bumps 34a to 34c connected to the electrodes 31a to 31c. For example, the electrode 31b is connected to an emitter of a transistor constituting the power amplifier 30, and is electrically connected to the electrode 24b via the bump 34b, the wiring pattern 23b, and the thermal vias 25a and 25b. Thus, heat produced at the emitter, which is a portion of the power amplifier 30 from which heat is generated, is transferred to the electrode 24b and is then dissipated thereby.

A metal layer 35 is defined on the surface 32 of the power amplifier 30, which is positioned closer to the conductive shield. The metal layer 35 is formed of a metal such as gold, silver, copper, aluminum, or titanium, for example. The metal layer 35 has a wire 36 (a conductive path) defined thereon. The wire 36 is cut on the conductive shield 60 side, and has cut portions 37a and 37b connected to the conductive shield 60. That is, the metal layer 35 and the wire 36 form a conductive unit (a second conductive unit) electrically connected to the conductive shield 60. The wire 36 is formed of a metal such as gold, silver, copper, or aluminum, for example. Since the metal layer 35 is defined on the surface 33 of the power amplifier 30, heat produced by the power amplifier 30 is also dissipated via the metal layer 35. Since the metal layer 35 is connected to the conductive shield 60 via the wire 36, the heat dissipation effect can be further enhanced.

Further, for example, on side surfaces of the package substrate 20, the conductive shield 60 is connected to the ground wiring 26. Accordingly, the potential of the metal layer 35 of the power amplifier 30 is fixed to a ground level. This makes it possible to stabilize the operation of the power amplifier 30.

The SAW duplexer 40 is a component that separates a reception signal from a base station and a transmission signal to the base station. The SAW duplexer 40 has a surface 43 (a first surface) on which electrodes 41a and 41b are defined, and a surface 42 (a second surface) opposite the surface 43. The SAW duplexer 40 is mounted face-down on the top surface 21 of the package substrate 20 via bumps 44a and 44b connected to the electrodes 41a and 41b. The SAW duplexer 40 has an interdigital electrode unit 45. The SAW duplexer 40 further has a cavity 46 that is an operating space of the interdigital electrode unit 45.

A metal layer 47 (a first conductive unit) is defined on the surface 43 of the SAW duplexer 40, which is positioned closer to the conductive shield. The metal layer 47 is formed of a metal such as gold, silver, copper, aluminum, or titanium, for example. The metal layer 47 has a wire 48 (a conductive path) defined thereon. The wire 48 is cut on the conductive shield 60 side, and has cut portions 49a and 49b connected to the conductive shield 60. That is, the metal layer 47 and the wire 48 form a conductive unit (a first conductive unit) electrically connected to the conductive shield 60. The wire 48 is formed of a metal such as gold, silver, copper, or aluminum, for example. Since the metal layer 47 is defined on the surface 43 of the SAW duplexer 40, heat produced by the SAW duplexer 40 is dissipated via the metal layer 47. Since the metal layer 47 is connected to the conductive shield 60 via the wire 48, the heat dissipation effect can be further enhanced.

Further, for example, on the side surfaces of the package substrate 20, the conductive shield 60 is connected to the ground wiring 26. Accordingly, the potential of the metal layer 47 of the SAW duplexer 40 is fixed to a ground level. This makes it possible to stabilize the operation of the SAW duplexer 40. In the SAW duplexer 40, in particular, a reception signal from a base station and a transmission signal to the base station may be crossed via the metal layer 47. Hence, fixing the metal layer 47 to a ground level makes it possible to suppress such crossing (cross talk).

Next, a process of manufacturing the power amplifier module 10A will be described with reference to FIGS. 2A to 2E.

Figure 2A:
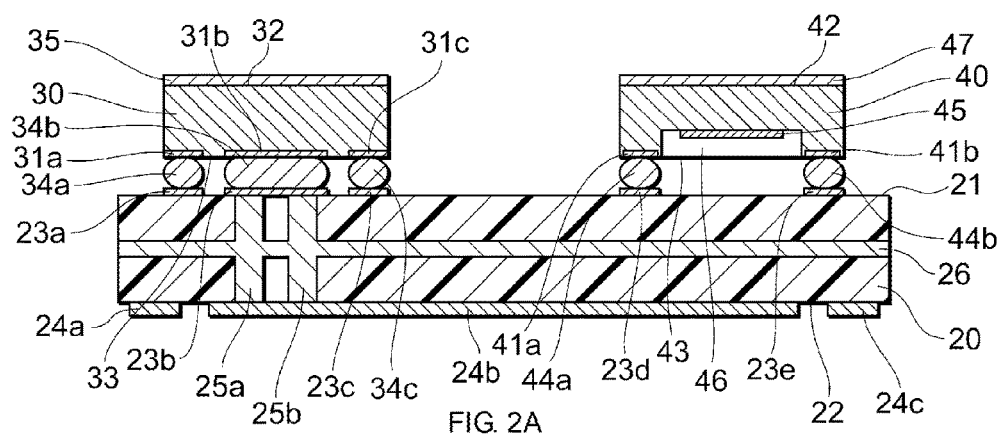
FIG. 2A is a diagram illustrating a face-down mounting step in a process of manufacturing the power amplifier module 10A.

First, as illustrated in FIG. 2A, the power amplifier 30 and the SAW duplexer 40 are mounted face-down on the top surface 21 of the package substrate 20.

Figure 2B:
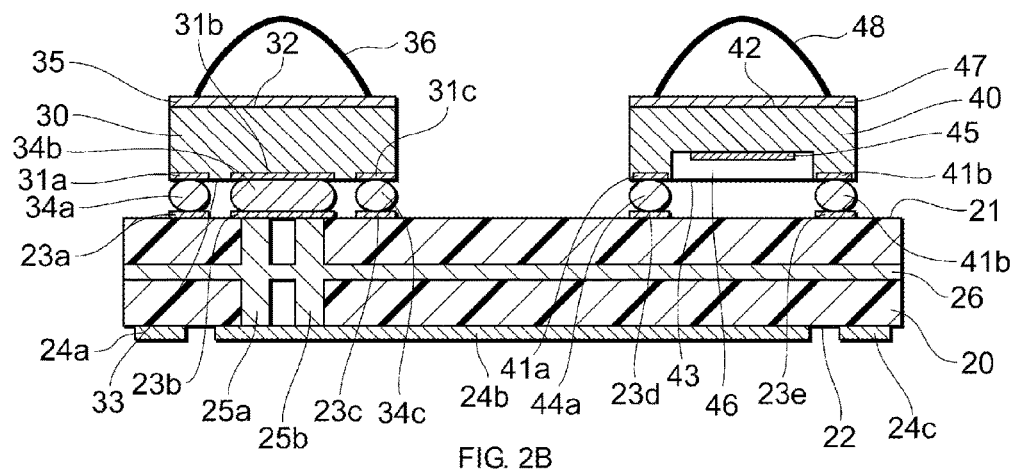
FIG. 2B is a diagram illustrating a wire forming step in the process of manufacturing the power amplifier module 10A.

Then, as illustrated in FIG. 2B, the wire 36 is formed on the metal layer 35, which is defined on the surface 32 of the power amplifier 30, by wire bonding. Likewise, the wire 48 is formed on the metal layer 47, which is defined on the surface 42 of the SAW duplexer 40, by wire bonding. A plurality of wires 36 and a plurality of wires 48 may be formed. The wires 36 and 48 may be formed on the metal layers 35 and 47 prior to face-down mounting.

The wire 36 may also be formed so as to be connected to a GND electrode (not illustrated) on the first principal surface of the package substrate 20 from the metal layer 35 defined on the surface 32 of the power amplifier 30. The wire 48 of the SAW duplexer is also formed in a similar way.

Figure 2C:
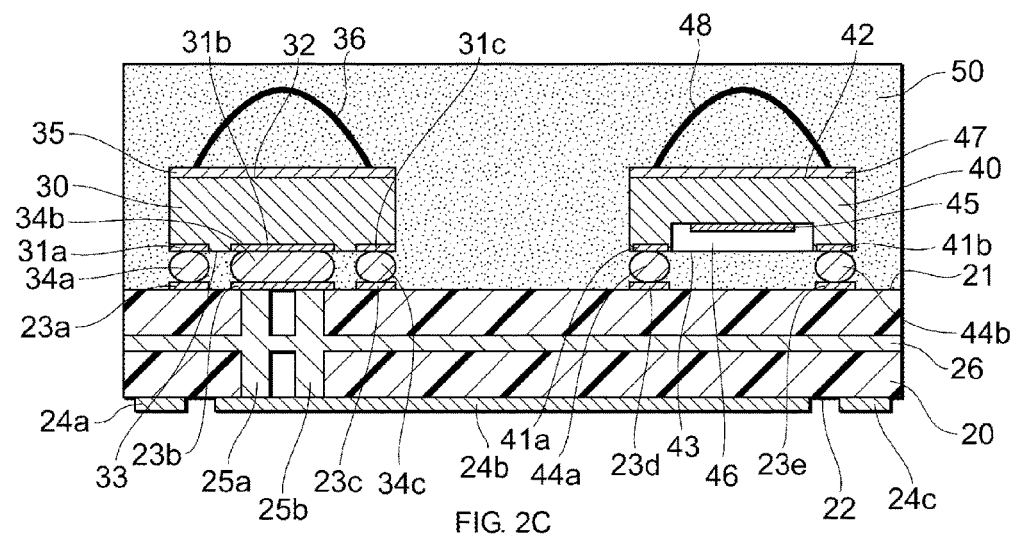
FIG. 2C is a diagram illustrating a resin sealing step in the process of manufacturing the power amplifier module 10A.

Thereafter, as illustrated in FIG. 2C, the power amplifier 30 and the SAW duplexer 40 are covered (sealed) by the insulating resin 50. The wires 36 and 48 are also covered by the insulating resin 50.

Figure 2D:
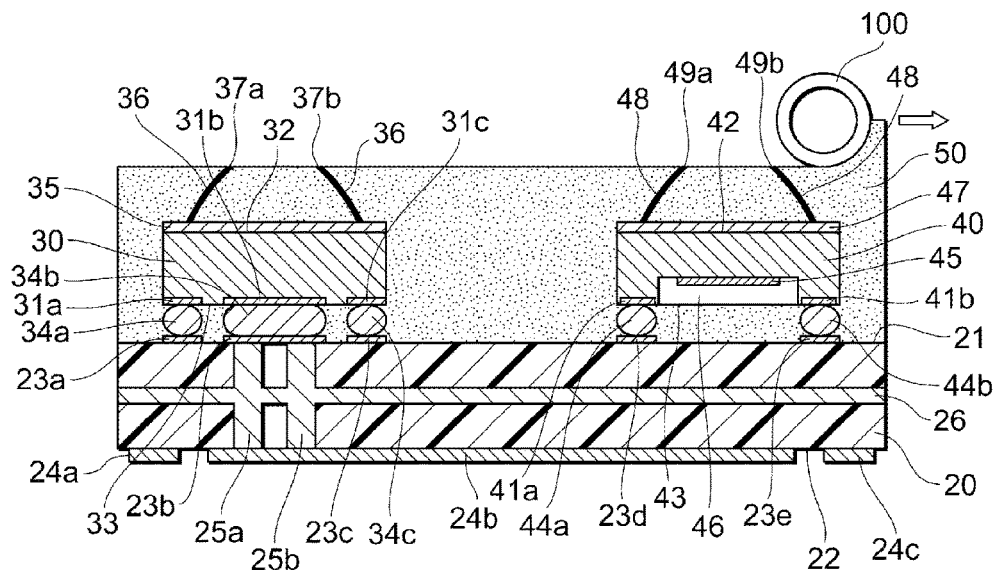
FIG. 2D is a diagram illustrating a resin grinding step in the process of manufacturing the power amplifier module 10A.
Figure 2E:
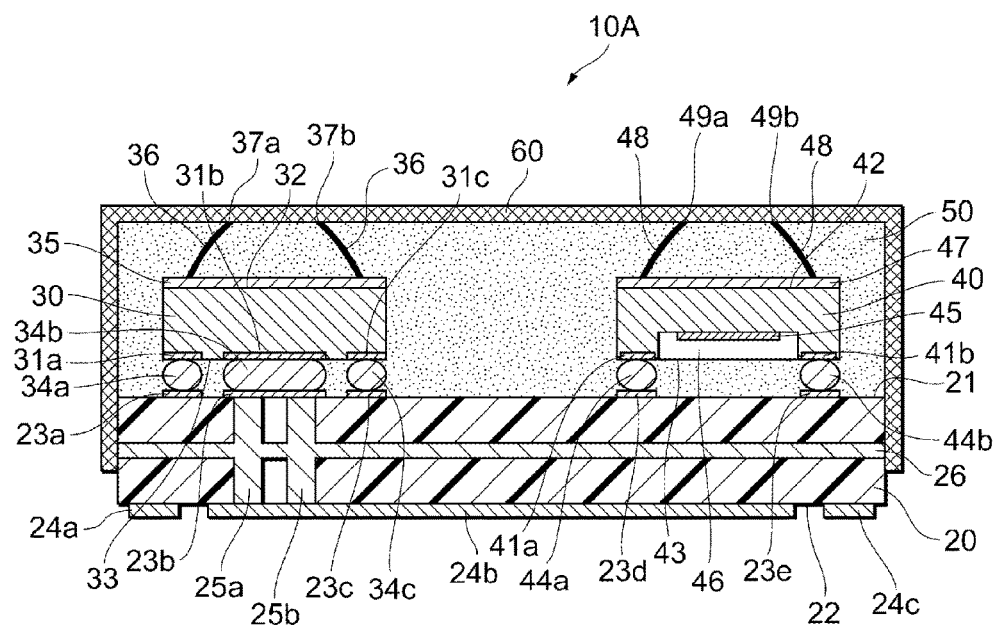
FIG. 2E is a diagram illustrating a conductive shield forming step in the process of manufacturing the power amplifier module 10A.

Subsequently, as illustrated in FIG. 2D, a surface of the insulating resin 50 is ground with a grinder 100 to expose the wires 36 and 48. Specifically, a portion of the wire 36 is cut and the cut portions 37a and 37b are exposed. Likewise, a portion of the wire 48 is cut and the cut portions 49a and 49b are exposed. The wires 36 and 48 may be exposed in such a way that the wires 36 and 48 are not cut.

Finally, the conductive shield 60 is formed so as to cover the insulating resin 50. Thus, the conductive shield 60 is connected to the metal layer 35 via the cut portions 37a and 37b of the wire 36. Further, the conductive shield 60 is connected to the metal layer 47 via the cut portions 49a and 49b of the wire 48.

Through the steps described above, the power amplifier module 10A illustrated in FIG. 1 can be manufactured.

Figure 3:
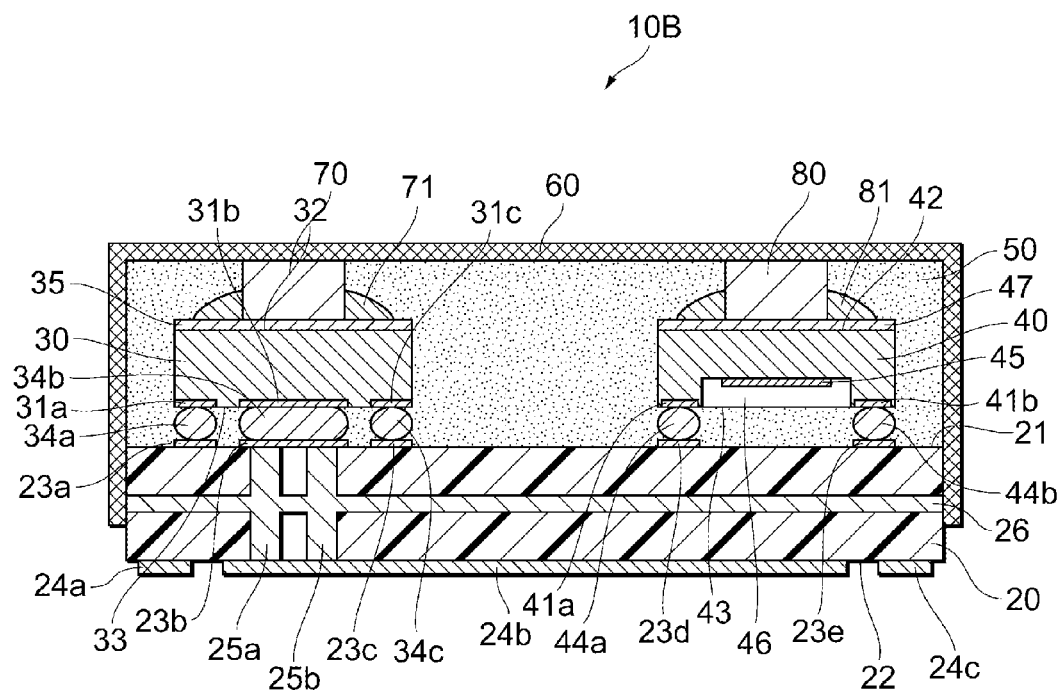
FIG. 3 is a diagram illustrating a configuration of a power amplifier module 10B, which is an exemplary modification of the power amplifier module 10A.

FIG. 3 is a diagram illustrating a configuration of a power amplifier module 10B, which is an exemplary modification of the power amplifier module 10A. The same elements as those of the power amplifier module 10A are assigned the same numerals and are not described herein.

The power amplifier module 10B includes a conductive unit 70 and a conductive paste 71, instead of the wire 36. The conductive unit 70 (a conductive path) is a columnar metal or a metal pin, for example, and has a bottom surface connected to the metal layer 35 by using the conductive paste 71. Further, a top surface of the conductive unit 70 is connected to the conductive shield 60. The conductive unit 70 is a metal such as gold, silver, copper, or aluminum, for example. The conductive paste 71 is, for example, a material or solder made by mixing conductive particles of silver, carbon, or the like into resin.

The power amplifier module 10B includes a conductive unit 80 and a conductive paste 81, instead of the wire 48. The conductive unit 80 is columnar, for example, and has a bottom surface connected to the metal layer 47 by using the conductive paste 81. Further, a top surface of the conductive unit 80 is connected to the conductive shield 60. The conductive unit 80 is a metal such as gold, silver, copper, or aluminum, for example. The conductive paste 81 is, for example, a material or solder made by mixing conductive particles of silver, carbon, or the like into resin.

In the power amplifier module 10B, the use of the conductive units 70 and 80 instead of the wires 36 and 48 improves the heat dissipation capability of the power amplifier 30 and the SAW duplexer 40. In addition, similarly to the power amplifier module 10A, the conductive shield 60 is connected to the ground wiring 26, thus making it possible to stabilize the operation of the power amplifier 30 and the SAW duplexer 40.

Figure 4:
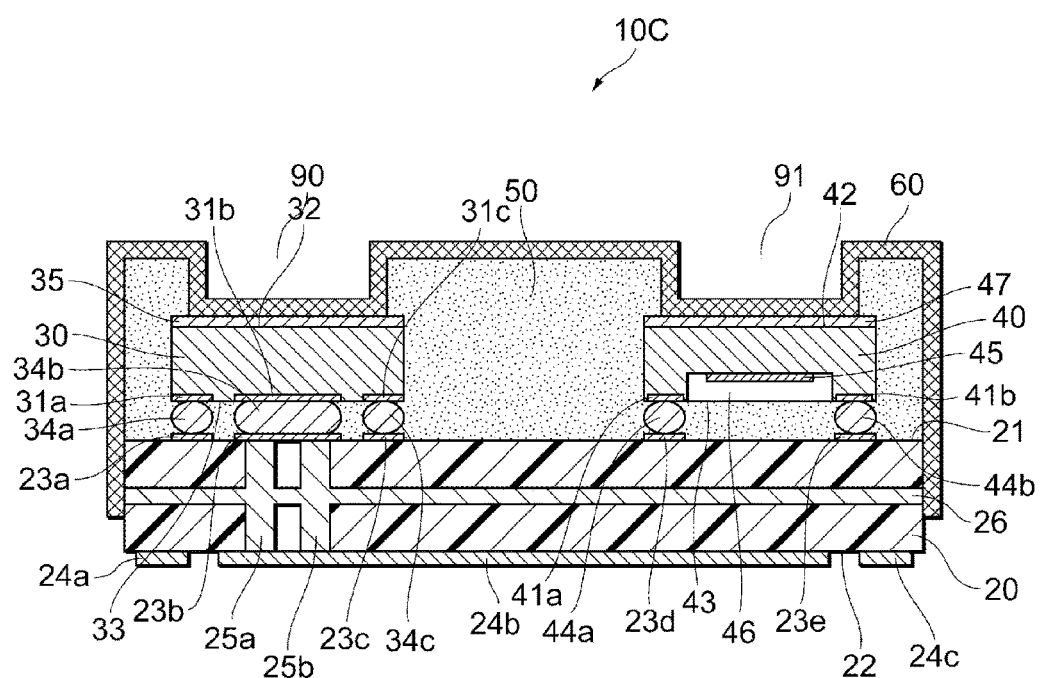
FIG. 4 is a diagram illustrating a configuration of a power amplifier module 10C, which is an exemplary modification of the power amplifier module 10A.

FIG. 4 is a diagram illustrating a configuration of a power amplifier module 10C, which is an exemplary modification of the power amplifier module 10A. The same elements as those of the power amplifier module 10A are assigned the same numerals and are not described herein.

The power amplifier module 10C does not include the wires 36 and 48 of the power amplifier module 10A. Instead of them, the power amplifier 30 and the SAW duplexer 40 have holes 90 and 91 defined in upper portions thereof. The holes 90 and 91 are formed by, for example, applying a laser to the insulating resin 50 from above the power amplifier 30 and the SAW duplexer 40. In a state where the holes 90 and 91 have been formed, surfaces of the metal layers 35 and 47 are exposed. Thereafter, the conductive shield 60 is formed by sputtering or the like, resulting in the conductive shield 60 and the metal layers 35 and 47 being connected to each other.

In the power amplifier module 10C, directly connecting the metal layers 35 and 47 to the conductive shield 60 improves the heat dissipation capability of the power amplifier 30 and the SAW duplexer 40. In addition, similarly to the power amplifier module 10A, the conductive shield 60 is connected to the ground wiring 26, thus making it possible to stabilize the operation of the power amplifier 30 and the SAW duplexer 40.

Figure 5:
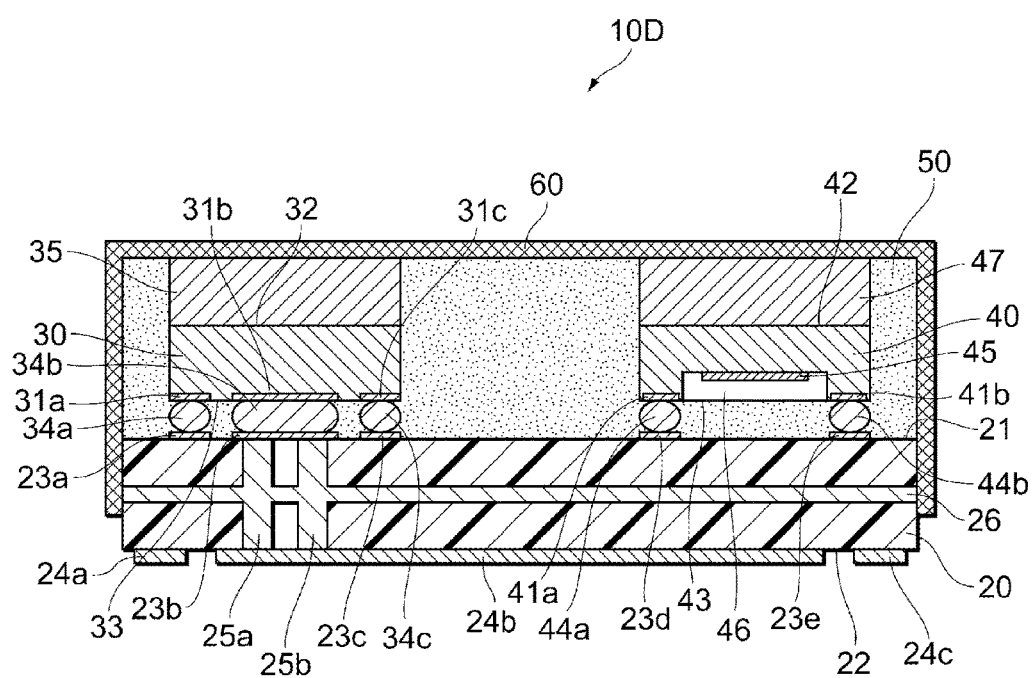
FIG. 5 is a diagram illustrating a configuration of a power amplifier module 10D, which is an exemplary modification of the power amplifier module 10A.

FIG. 5 is a diagram illustrating a configuration of a power amplifier module 10D, which is an exemplary modification of the power amplifier module 10A. The same elements as those of the power amplifier module 10A are assigned the same numerals and are not described herein.

The power amplifier module 10D does not include the wires 36 and 48 of the power amplifier module 10A. Instead of them, the metal layers 35 and 47 have a larger thickness than those of the power amplifier module 10A. Further, the top surfaces of the metal layers 35 and 47 are directly connected to the conductive shield 60.

In the power amplifier module 10D, directly connecting the metal layers 35 and 47 to the conductive shield 60 improves the heat dissipation capability of the power amplifier 30 and the SAW duplexer 40. In addition, similarly to the power amplifier module 10A, the conductive shield 60 is connected to the ground wiring 26, thus making it possible to stabilize the operation of the power amplifier 30 and the SAW duplexer 40.

The power amplifier modules 10A to 10D, which are examples of an embodiment of the present disclosure, have been described.

In the power amplifier modules 10A to 10D, a conductive unit to be electrically connected to the conductive shield 60 is defined on a surface of the face-down mounted SAW duplexer 40, which is positioned closer to the conductive shield 60. Accordingly, heat of the SAW duplexer 40, which is difficult to dissipate from the package substrate 20 side due to the influence of the cavity 46, can be dissipated from the conductive shield 60 side.

In the power amplifier module 10A, the wire 48 is provided as a conductive path for connecting the metal layer 47 to the conductive shield 60. The wire 48 can be easily formed on the metal layer 47 by wire bonding. Thus, the process of manufacturing the power amplifier module 10A can be simplified.

In the power amplifier module 10A, furthermore, the insulating resin 50 is ground to cut a portion of the wire 48, resulting in the cut portions 49a and 49b being formed. Then, the cut portions 49a and 49b are connected to the conductive shield 60. As illustrated in FIG. 2D, high-accuracy work is required to expose the wire 48 without cutting the wire 48 when the insulating resin 50 is ground. In the power amplifier module 10A, in contrast, there is no need to stop the grinding of the insulating resin 50 at the portion where the wire 48 is not cut. Thus, the process of manufacturing the power amplifier module 10A can be simplified. In addition, the cut portions 49a and 49b ensure that the wire 48 can be connected to the conductive shield 60.

In the power amplifier modules 10A to 10D, the conductive shield 60 is connected to the ground wiring 26 defined in the package substrate 20. This allows the potential of the metal layer 47 of the SAW duplexer 40 to be fixed to a ground level and makes it possible to stabilize the operation of the SAW duplexer 40.

In the power amplifier modules 10A to 10D, furthermore, the power amplifier 30, whose heat is dissipated from the bottom surface 22 of the package substrate 20 through the thermal vias 25a and 25b, has also defined on a surface thereof, which is positioned closer to the conductive shield 60, a conductive unit to be electrically connected to the conductive shield 60. This makes it possible to improve the heat dissipation capability of the power amplifier 30.

In the power amplifier modules 10A to 10D, the power amplifier 30 also has defined on a surface thereof, which is positioned closer to the conductive shield 60, a conductive unit to be electrically connected to the conductive shield 60. However, the power amplifier 30 may not have such a conductive unit.

The embodiments described above described above are intended for easy understanding of the present invention, and it is not intended to construe the present invention in a limiting fashion. Changes/improvements can be made to the present invention without departing from the gist of the present invention, and equivalents thereof are also included in the present invention. That is, the embodiments may be appropriately changed in design by those skilled in the art, and such changes also fall within the scope of the present invention so long as the changes include the features of the present invention. For example, the elements included in the embodiments and the arrangement, materials, conditions, shapes, sizes, and the like thereof are not limited to those described in the illustrated examples but can be changed as appropriate. In addition, the elements included in the embodiments can be combined as much as technically possible, and such combined elements also fall within the scope of the present invention so long as the combined elements include the features of the present invention.

REFERENCE SIGNS LIST 10A, 10B, 10C, 10D power amplifier module
20 package substrate
21 top surface
22 bottom surface
23a, 23b, 23c, 23d, 23e wiring pattern
24a, 24b, 24c, 31a, 31b, 31c, 41a, 41b electrode
25a, 25b thermal via
26 ground wiring
30 power amplifier
34a, 34b, 34c, 44a, 44b bump
35, 47 metal layer
36, 48 wire
37a, 37b, 49a, 49b cut portion
40 SAW duplexer
45 interdigital electrode unit
46 cavity
50 insulating resin
60 conductive shield
70, 80 conductive unit
71, 81 conductive paste
90, 91 hole

The invention claimed is:

1. A power amplifier module comprising:
a substrate having a first principal surface and a second principal surface;
a power amplifier having a first surface on which an electrode is defined and a second surface opposite the first surface, the power amplifier being mounted so that the first surface faces the first principal surface of the substrate;
a surface acoustic wave duplexer having a first surface on which an electrode is defined and a second surface opposite the first surface, the surface acoustic wave duplexer being mounted so that the first surface faces the first principal surface of the substrate;
a heat dissipation electrode on the second principal surface of the substrate;
a heat dissipation path that connects at least part of a mount between the power amplifier and the first principal surface of the substrate to the heat dissipation electrode;
an insulating resin that covers the power amplifier and the surface acoustic wave duplexer; and
a conductive shield that covers a surface of the insulating resin, wherein the second surface of the surface acoustic wave duplexer is electrically connected to the conductive shield.

2. The power amplifier module according to claim 1, further comprising:
a metal layer on the second surface of the surface acoustic wave duplexer, and
a conductive path for electrically connecting the metal layer to the conductive shield.

3. The power amplifier module according to claim 2, wherein the conductive path is a wire defined on the metal layer.

4. The power amplifier module according to claim 3, wherein the wire has a cut portion that is cut on a conductive shield side, and the cut portion of the wire is connected to the conductive shield.

5. The power amplifier module according to claim 2, wherein the conductive path is connected to the metal layer with a conductive paste.

6. The power amplifier module according to claim 2, wherein the conductive path is a columnar metal or a metal pin.

7. The power amplifier module according to claim 1, further comprising a metal layer on the second surface of the surface acoustic wave duplexer, wherein the metal layer is directly connected to the conductive shield.

8. The power amplifier module according to claim 1, further comprising a ground wiring defined in the substrate, wherein the conductive shield is electrically connected to the ground wiring.

9. The power amplifier module according to claim 1, further comprising:
a metal layer on the second surface of the power amplifier, and
a conductive path for electrically connecting the metal layer on the power amplifier to the conductive shield.

10. The power amplifier module according to claim 9, wherein the conductive path for electrically connecting the metal layer on the power amplifier to the conductive shield is a wire defined on the metal layer on the power amplifier.

11. The power amplifier module according to claim 10, wherein the wire defined on the metal layer on the power amplifier has a cut portion that is cut on a conductive shield side, and the cut portion of the wire defined on the metal layer on the power amplifier is connected to the conductive shield.

12. The power amplifier module according to claim 9, wherein the conductive path for electrically connecting the metal layer on the power amplifier to the conductive shield is connected to the metal layer on the power amplifier with a conductive paste.

13. The power amplifier module according to claim 9, wherein the conductive path for electrically connecting the metal layer of the power amplifier to the conductive shield is a columnar metal or a metal pin.

14. The power amplifier module according to claim 1, further comprising a metal layer on the second surface of the power amplifier, wherein the metal layer on the second surface of the power amplifier is directly connected to the conductive shield.

* * * * *